United States Patent
Heim et al.

(10) Patent No.: US 9,279,874 B2
(45) Date of Patent: Mar. 8, 2016

(54) SIGNAL PROCESSING FOR A CAPACITIVE SENSOR SYSTEM WITH ROBUSTNESS TO NOISE

(71) Applicant: Microchip Technology Incorporated, Chandler, AZ (US)

(72) Inventors: Axel Heim, Munich (DE); Martin Hoch, Gilching (DE)

(73) Assignee: MICROCHIP TECHNOLOGY GERMANY GMBH, Rosenheim (DE)

( * ) Notice: Subject to any disclaimer, the term of this patent is extended or adjusted under 35 U.S.C. 154(b) by 289 days.

(21) Appl. No.: 13/967,324

(22) Filed: Aug. 14, 2013

(65) Prior Publication Data

US 2014/0049266 A1 Feb. 20, 2014

Related U.S. Application Data

(60) Provisional application No. 61/684,009, filed on Aug. 16, 2012.

(51) Int. Cl.
| | | |
|---|---|---|
| *G01R 27/26* | (2006.01) | |
| *G01R 35/00* | (2006.01) | |
| *G01D 5/24* | (2006.01) | |
| *G06F 3/044* | (2006.01) | |
| *H03K 17/96* | (2006.01) | |

(52) U.S. Cl.
CPC .............. *G01R 35/005* (2013.01); *G01D 5/24* (2013.01); *G06F 3/044* (2013.01); *H03K 17/962* (2013.01); *H03K 2217/9607* (2013.01)

(58) Field of Classification Search
CPC ........ G01D 5/24; G06F 3/044; G01R 35/005; H03K 17/962; H03K 2217/9607
USPC ............. 324/603, 600, 658, 686, 519, 750.17
See application file for complete search history.

(56) References Cited

U.S. PATENT DOCUMENTS

| | | | | |
|---|---|---|---|---|
| 4,922,061 | A * | 5/1990 | Meadows et al. .............. | 347/175 |
| 6,025,726 | A * | 2/2000 | Gershenfeld et al. ......... | 324/671 |
| 2011/0097215 | A1 | 4/2011 | O'shaughnessy et al. ...... | 417/48 |
| 2013/0176039 | A1 * | 7/2013 | Lamesch ....................... | 324/683 |
| 2013/0271410 | A1 | 10/2013 | Krah et al. ..................... | 345/173 |

FOREIGN PATENT DOCUMENTS

| | | | | |
|---|---|---|---|---|
| DE | 202008007929 U1 | 9/2008 | ............. | G06F 3/037 |
| EP | 0818751 A1 | 1/1998 | ............. | G06F 3/033 |
| WO | 99/00166 A1 | 1/1999 | ............. | A41D 13/00 |
| WO | 2004/007045 A1 | 1/2004 | ............. | A41D 31/00 |
| WO | 2004/028670 A1 | 4/2004 | ............. | A47C 31/10 |
| WO | 2009/024779 A1 | 2/2009 | ............. | A41D 13/05 |
| WO | 2011/154468 A1 | 12/2011 | ........... | H03K 17/955 |

OTHER PUBLICATIONS

International Search Report and Written Opinion, Application No. PCT/EP2013/067099, 13 pages, Apr. 8, 2014.

* cited by examiner

*Primary Examiner* — Hoai-An D Nguyen

(74) *Attorney, Agent, or Firm* — Slayden Grubert Beard PLLC

(57) ABSTRACT

A capacitive sensor includes a transmit electrode configured to provide an alternating electric field to a sensor; one or more receive electrodes for detecting variations in the alternating electric field; and an adaptive frequency adjustment unit configured to adjust an operating frequency of the alternating electric field responsive to detection of a noise measure, such as noise power.

28 Claims, 8 Drawing Sheets

SIGNAL PROCESSING FOR A CAPACITIVE SENSOR SYSTEM WITH ROBUSTNESS TO NOISE

CROSS REFERENCE TO RELATED APPLICATIONS

This application claims priority from U.S. Provisional Patent Application Ser. No. 61/684,009, filed Aug. 16, 2012, which is hereby incorporated by reference in its entirety as if fully set forth herein.

TECHNICAL FIELD

The present disclosure relates to methods and systems for capacitive sensor systems, in particular to signal processing in such systems.

BACKGROUND

Capacitive sensor systems can be realized by generating an alternating electrical field and measuring the potential difference (i.e., the voltage) obtained in one cycle at a sensor electrode within this field. A single electrode or a transmitting and one or more receiving electrodes may be used. This voltage is a measure for the capacitance between the sensor electrode and its electrical environment, i.e., it is influenced by objects like a human finger or a hand. Further, from this voltage, for example, the distance of a finger can be deduced. This information can be used for human-machine interfaces.

The problem with conventional systems operating according to the above-mentioned principle is that electrical noise sources, such as fluorescent lamps or USB chargers can affect the electrical field. Thus, accurately and reliably estimating this voltage in a noisy environment is problematic.

SUMMARY

According to various embodiments, a capacitive sensor system is provided that implements automatic adaptation of an operating frequency in environments with frequency selective noise. A capacitive sensor according to embodiments includes a transmit electrode configured to provide an alternating electric field to a sensor; one or more receive electrodes for detecting variations in the alternating electric field; and an adaptive frequency adjustment unit configured to adjust an operating frequency of the alternating electric field responsive to detection of a noise measure, such as noise power. In some embodiments, the adaptive frequency adjustment unit is configured to determine a plurality of noise powers at potential operating frequencies and select a new operating frequency.

A method for providing noise robustness to a capacitive sensing system according to embodiments includes defining a plurality of potential operating transmit frequencies; determining a corresponding noise measure corresponding to each of the potential operating frequencies; operating the capacitive sensing system at one of the plurality of potential operating transmit frequencies; measuring an operating noise measure at the operating frequency; and selecting a new operating frequency responsive to a value of the measured operating noise measure.

A capacitive sensor system according to embodiments includes a transmit electrode configured to provide an alternating electric field to a sensor; one or more receive electrodes for detecting variations in the alternating electric field; and an adaptive frequency adjustment unit configured to adjust an operating frequency of the alternating electric field in accordance with modeling the capacitive sensor system as an amplitude modulation system with direct sampling and synchronous demodulation. In some embodiments, the adaptive frequency adjustment unit is configured to determine a plurality of noise measures at potential operating frequencies and select an operating frequency that corresponds to a minimum or maximum of the plurality of noise measures.

A sensor system according to embodiments includes an alternating electric field sensor arrangement being subject to noise and being coupled with a signal processing unit receiving a noisy signal, wherein the signal processing unit converts the noisy signal to a digital signal, wherein the signal processing unit is further configured to demodulate the sampled signal by multiplication with $(-1)^k$, where k indicates the discrete time, subsequent low-pass filtering, subsequent decimation by a factor R, and further low-pass filtering. The signal processing unit may be further operable to perform a distance estimation, positioning or gesture recognition from the processed signal. The alternating electric field may be generated by a pulse signal.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features and wherein.

DETAILED DESCRIPTION

The disclosure and various features and advantageous details thereof are explained more fully with reference to the exemplary, and therefore non-limiting, embodiments illustrated in the accompanying drawings and detailed in the following description. It should be understood, however, that the detailed description and the specific examples, while indicating the preferred embodiments, are given by way of illustration only and not by way of limitation. Descriptions of known programming techniques, computer software, hardware, operating platforms and protocols may be omitted so as not to unnecessarily obscure the disclosure in detail. Various substitutions, modifications, additions and/or rearrangements within the spirit and/or scope of the underlying inventive concept will become apparent to those skilled in the art from this disclosure.

Figure 1:
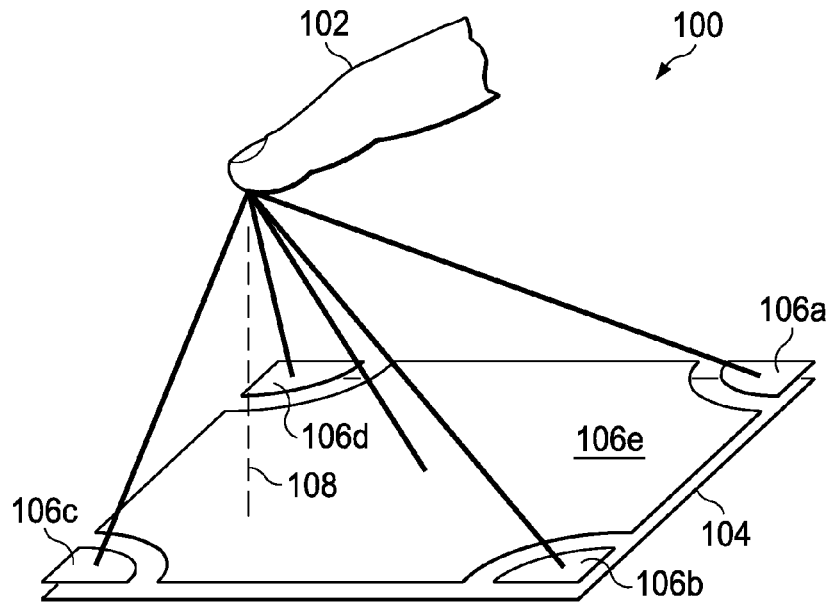
FIG. 1 depicts a diagrammatic representation of exemplary capacitive sensing.

Turning now to the drawings and with particular attention to FIG. 1, an exemplary sensor electrode arrangement 100 for evaluation of an alternating electric field is shown. The sensor electrode arrangement includes a plurality of receive electrodes 106a-106e and one or more transmit electrodes 104. The one or more receive electrodes 106a-e are typically arranged in a layer above the transmit electrode 104, and with an insulating layer (not shown) arranged between the transmit and receive electrodes. The sensor electrode arrangement 100 is configured to determine an effect that an object, such as finger 102, has on the alternating electric field. A distance 108 between the finger 102 and the sensor electrode arrangement may thereby be determined.

More particularly, according to various embodiments, a front end device estimates the distance between finger 102 and the sensor arrangement by measuring the capacitance between the receive electrodes and the finger (GND). Potential changes at a capacitive voltage divider are excited by an alternating voltage.

Figure 2:
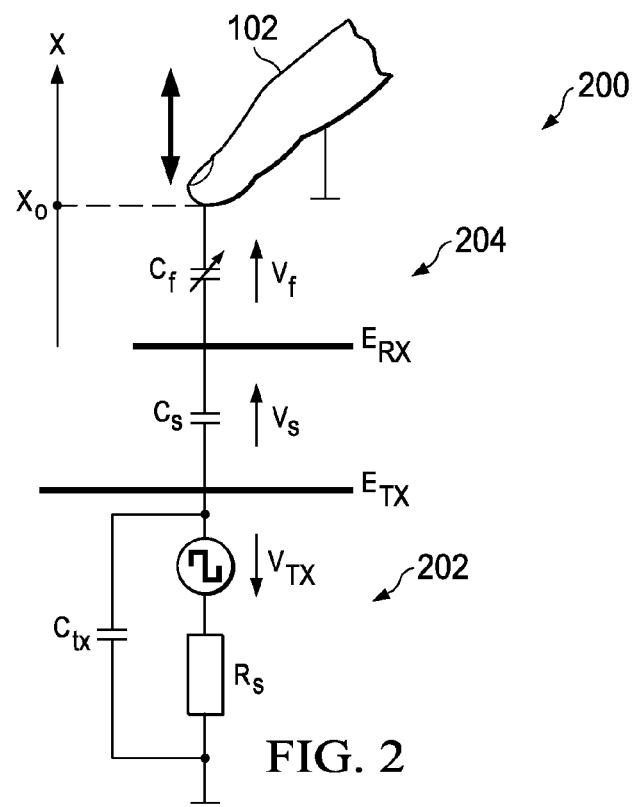
FIG. 2 depicts a diagrammatic representation of an exemplary capacitive sensor.

This is illustrated schematically with reference to FIG. 2. In particular, FIG. 2 shows a human finger 102 at distance $x_O$ over the cross-section of a capacitive sensor system 200 with a transmitter electrode $E_{TX}$ and a receiver electrode $E_{RX}$. $E_{TX}$ is excited using a rectangular pulse train voltage source 202, where the source resistance $R_s$ and the capacitance $C_{TX}$ between $E_{TX}$ and ground (GND) form a low-pass filter. The rectangular pulse train voltage typically has a frequency of 40-140 kHz. The variable capacitance $C_f$ between $E_{RX}$ and GND is dominated by the capacitance between $E_{RX}$ and the finger 102, which depends on the distance $x_O$ between finger and $E_{RX}$. $C_f$ and the constant capacitance $C_s$ between $E_{TX}$ and $E_{RX}$ build a capacitive voltage divider 204. Hence, the voltage $V_f$ is a function of $x_O$.

It is noted that further capacitances which are of minor importance for the basic understanding of the sensor system are omitted in the drawing. Also, the capacitance $C_f$ not only depends on the distance $x_O$, but on the three dimensional position of the finger tip, orientation of the hand, hand size, etc.

Figure 3:
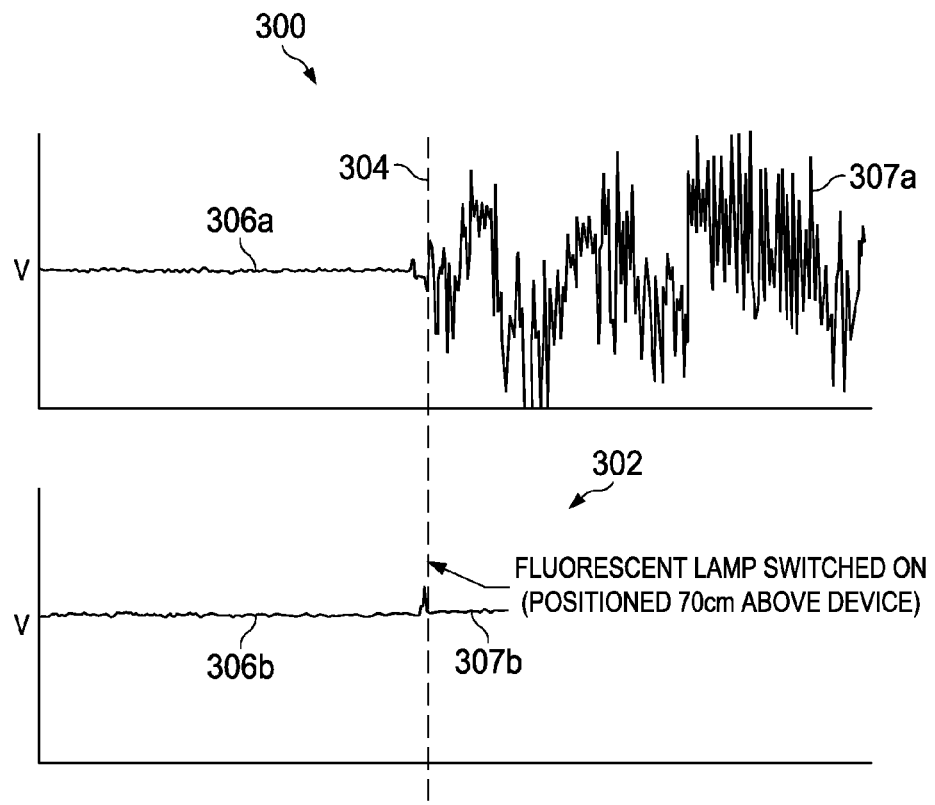
FIG. 3 illustrates exemplary noise and noise abatement.

FIG. 3 illustrates output signals 300, 302 of an integrated front end device. Output signal 300 shows the output signal without noise remediation, i.e., automatic frequency adaptation, according to embodiments, while output signal 302 is the output with automatic frequency adaptation according to embodiments. As shown, a noise source, such as a fluorescent lamp, is switched on at 304. The sensor signal 307a shows the effect of the noise, while the signal 307b shows a clean, noise-free signal.

As will be explained in greater detail below, according to various embodiments, noise robustness to the sensor electrode arrangement can be provided, for example, to an integrated front end circuit for direct evaluation of the sensor signals. According to various embodiments, channel noise can be automatically evaluated and best operating frequencies can be selected.

Figure 4:
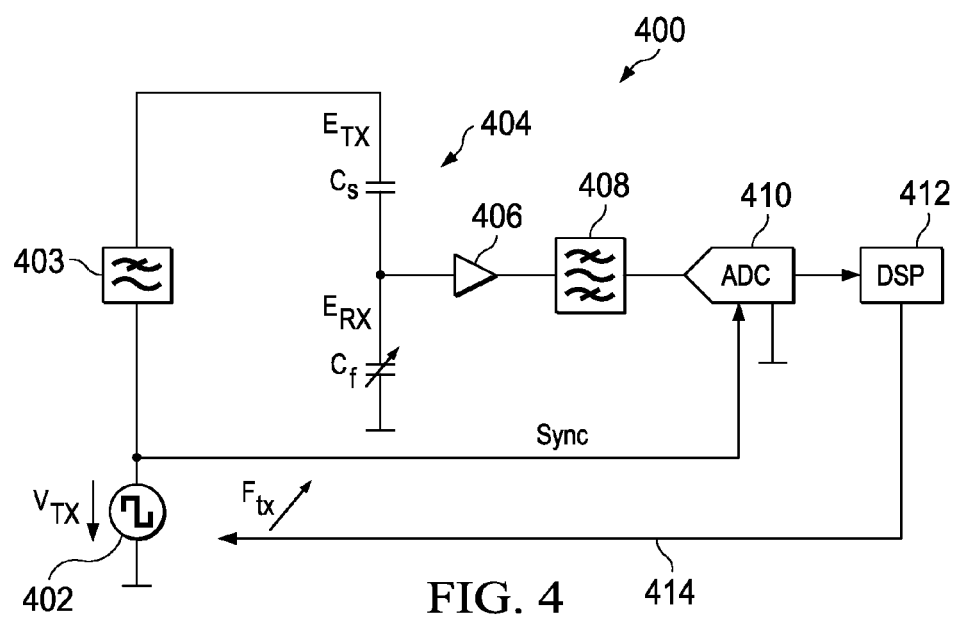
FIG. 4 depicts a diagrammatic representation of an exemplary capacitive sensor.

FIG. 4 illustrates an exemplary capacitive sensor 400 according to various embodiments. The output of the voltage source $V_{TX}$ is lowpass filtered at 403 and drives a capacitive voltage divider 404. The receive electrode $E_{RX}$ may be connected to an optional buffer 406, an analog band-pass filter 408, and an analog-to-digital converter (ADC) 410, which performs direct sampling. The ADC 410 may be synchronized with the voltage source to take two samples each transmitter period. The ADC's output is fed into a digital signal processing (DSP) unit 412. As will be explained in greater detail below, the DSP 412 controls the oscillator $V_{TX}$ via control path 414 to select an optimal operational frequency in the face of noisy conditions.

Figure 5:
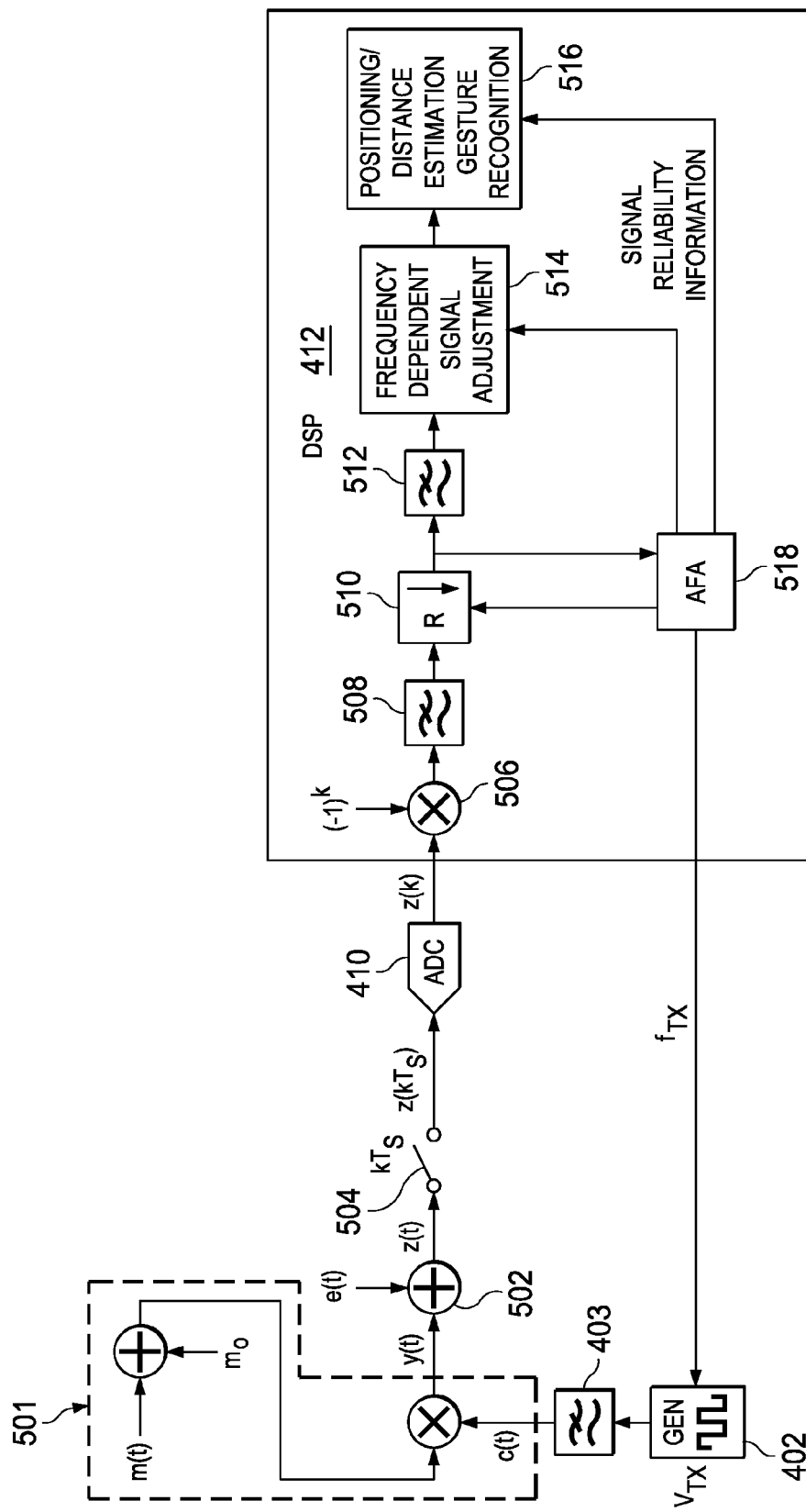
FIG. 5 depicts the exemplary capacitive sensor of FIG. 4 in greater detail.

FIG. 5 illustrates a communication theoretic model of the capacitive sensor of FIG. 4. In particular, as will be explained in greater detail below, the capacitive sensor may be modeled as an amplitude modulation system with direct sampling. An exemplary sampling frequency may be, for example, twice the frequency of the transmit signal $V_{TX}$. For example, if $f_{TX}$ is 100 kHz, then $f_s=1/T_s=2f_{TX}=200$ kHz. It is noted that other frequencies are possible.

The digital signal processing block 412 may implement digital demodulation 506, downsampling by R (e.g., to $f_s'=200$ Hz with R=1000), i.e. low-pass filtering 508 with subsequent decimation 510, low pass filtering 512, frequency dependent signal adjustment 514, and subsequent positioning and gesture recognition 516 according to various embodiments.

More particularly, the output of the lowpass filter 403, i.e., the lowpass filtered rectangular pulse train 402 may be modeled as a carrier signal c(t), where t denotes continuous time. The carrier signal c(t) is modulated 501 with [m0+m(t)], which is a function of the capacitance $C_f$ (FIG. 2, FIG. 4), yielding y(t).

At 502, the signal y(t) has added to it random noise e(t). The random noise e(t) may be representative of, for example, noise from fluorescent light bulbs or other sources. The resulting noisy signal z(t)=y(t)+e(t) is sampled 504 at discrete times $k*T_s$, where $T_s=1/(2*f_{TX})$ is the inverse of twice the transmitter frequency $f_{TX}$ and k=0, 1, 2, . . . is the discrete time index.

The ADC 410 converts the time-discrete signal into the digital domain. The ADC output z(k) is then processed by the DSP 412. In the example illustrated, the signal z(k) is digitally demodulated at 506 by multiplication with $(-1)^k$, low-pass filtered 508, decimated by factor R (typically 400-1400) 510, and low-pass filtered 512 a second time to only contain frequencies of hand movement (typically 0-20 Hz). It is then used for further processing like distance estimation, positioning or gesture recognition 516. An automatic frequency adaptation (AFA) module 514 receives the decimator output and provides control signals for adjusting the signal to provide robustness to frequency selective noise.

Figure 6:
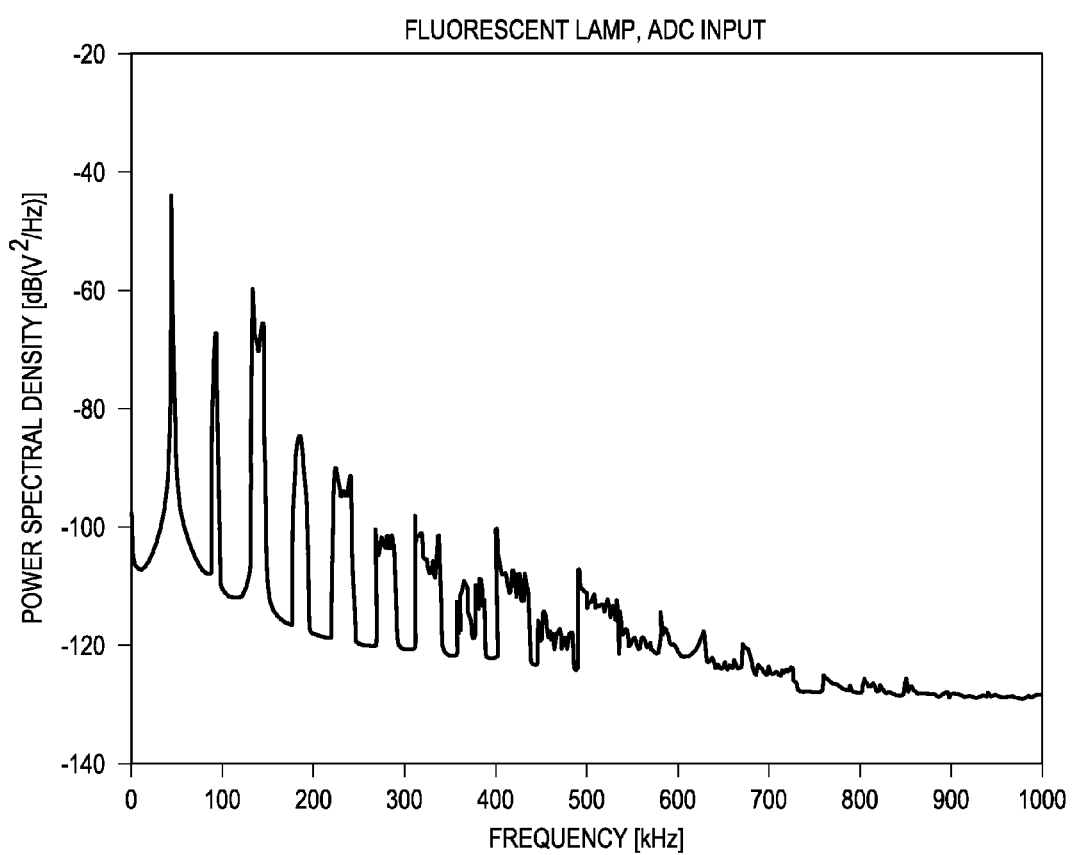
FIG. 6 is an exemplary noise power spectral density.
Figure 7:
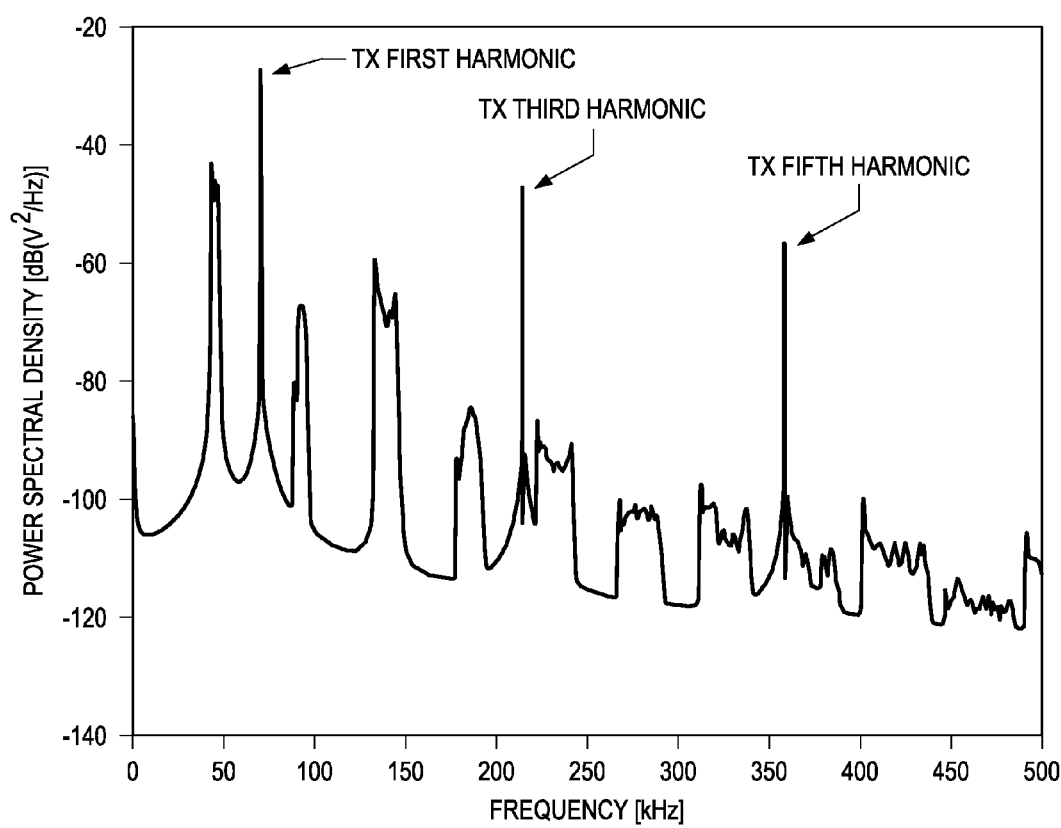
FIG. 7 is an exemplary power spectral density of a noisy input signal.

FIG. 6 shows the Power Spectral Density (PSD) of a fluorescent lamp as an example of an external noise source. This PSD, which has been measured at the ADC input of the system, shows harmonic narrow-band emission. If the system's TX frequency $f_{TX}$ (i.e., the carrier frequency) meets one of these emissions, the system is affected in recognizing a user's input. FIG. 7 shows a more detailed spectrum of an external noise source like a fluorescent lamp. It also includes the distinct peaks of the system's rectangular TX signal with an exemplary frequency of 70 kHz. In this example, $f_{TX}$ and its harmonics do not coincide with the emissions of the noise source.

Figure 8:
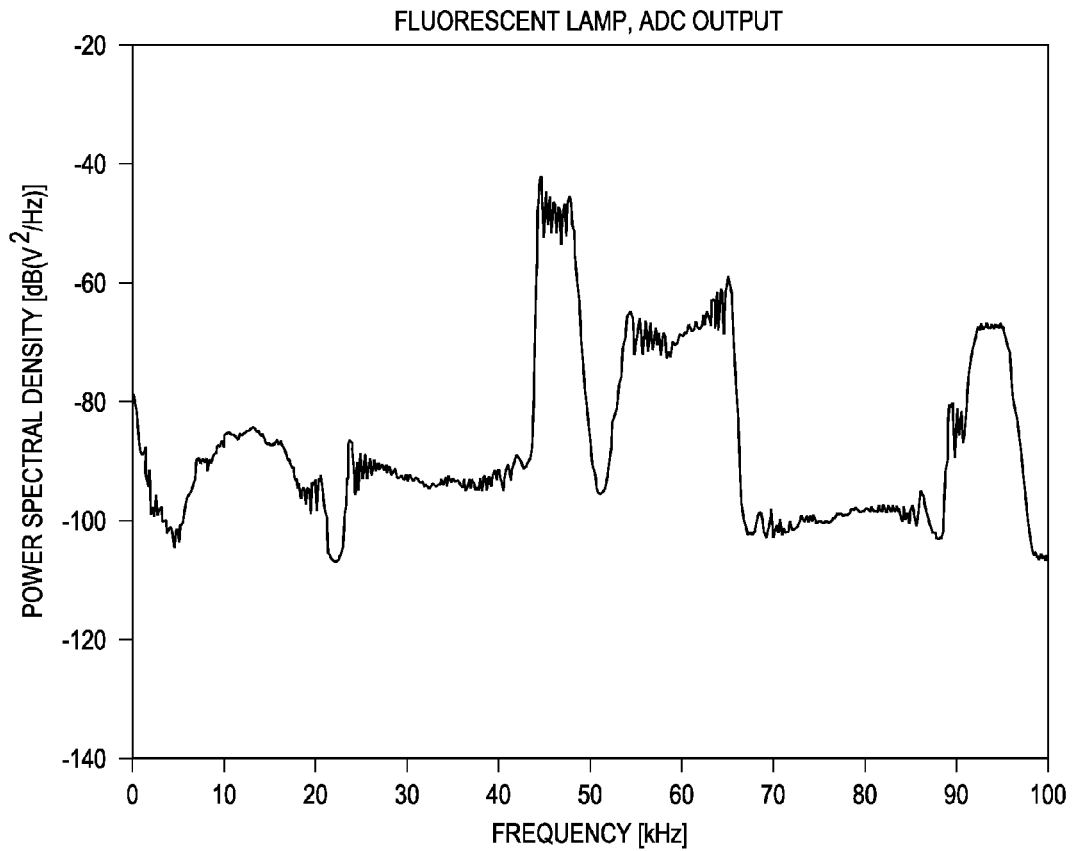
FIG. 8 is an exemplary power spectral density of a sampled, noisy input signal.

Depending on the steepness of the analog band-pass filter 408, even emissions at multiples of $f_{TX}$ will affect the system. For example, FIG. 8 shows the 3rd harmonic of the 47 kHz noise peak in the PSD in FIG. 6 folded into the 200 kHz band at (200−3*47)=59 kHz due to sampling after an insufficiently steep analog band-pass filter.

Figure 9:
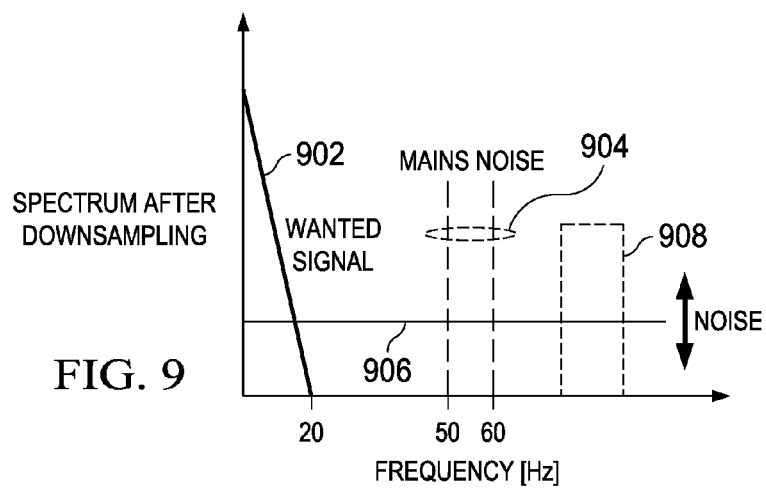
FIG. 9 is an schematic spectrum showing signals of interest.

The spectrum obtained after down-sampling 510 is depicted schematically in FIG. 9. The spectrum of the down-sampled signal is narrow compared to noise peaks in FIG. 8. External noise is now flat in the PSD. The estimate of external noise power 908 lies in a frequency band of, for example, 70-90 Hz.

The components of the spectrum after downsampling are a) the wanted signal (0-20 Hz) 902, b) known low-frequency noise, e.g., mains (i.e., 50 or 60 Hz line) voltage 904, which has been modulated onto the carrier due to non-linear system components, and c) a noise floor 906 that is representative of high frequency sources such as a fluorescent light. The noise floor 906 is approximately flat at the frequencies of interest and is relatively low if no high-frequency (HF) noise is present.

This noise floor 906 will rise if the current $f_{TX}$ lies in a noisy frequency band, whose width exceeds the sampling rate of the demodulated signal (which is the typical case). Hence, the HF noise power can be measured in the down-sampled signal in any frequency band that does not contain the wanted signal 902 or a known low-frequency noise 904, such as in band 908.

According to various embodiments, the Automatic Frequency Adaptation (AFA) unit 518 employs this noise power measurement technique. Other noise measures are possible, however.

Figure 10:
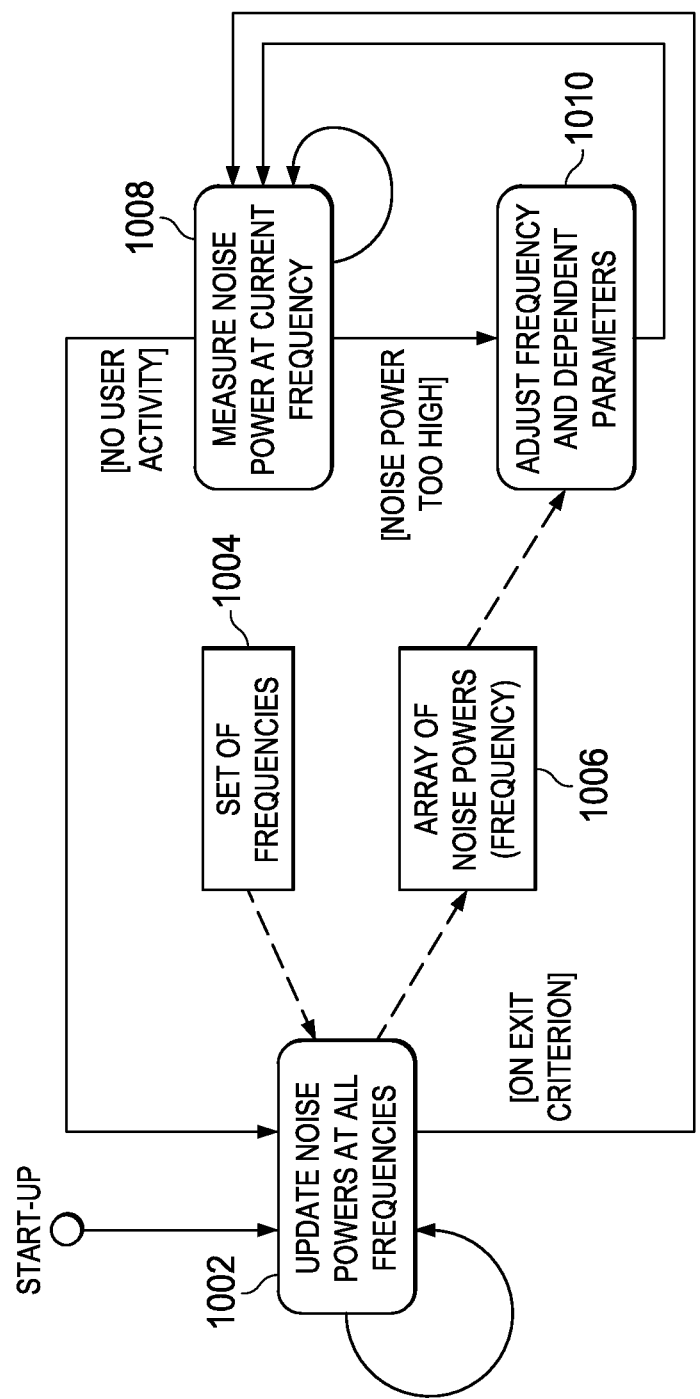
FIG. 10 is a diagram illustrating process flow according to embodiments.

Turning now to FIG. 10, a diagram illustrating an exemplary process according to embodiments is shown. At 1002, the AFA 518 performs a series of measurements of noise power on a pre-defined set 1004 of TX frequencies (e.g., eight frequencies in the range 40-140 kHz) at system's start-up or if no user activity is recognized (or on any other suitable event). Measurements are made, for example, in a band such as 908, shown in FIG. 9. The respective measured noise powers are saved in a dedicated array 1006. On an exit criterion, e.g., if all frequencies in the set 1004 have been investigated or the start of a user's activity is recognized, the system operates at a fixed TX frequency ($f_{TX}$). This frequency may be chosen to be the one that shows the lowest value in the array of noise powers 1006.

While the user is active, the AFA periodically measures the noise power 1008 at the current operating frequency $f_{TX}$. If the value of the noise power exceeds a certain threshold, the TX frequency f is adjusted to a different frequency having a lower noise power. For example, in some embodiments, the frequency is changed to the frequency that corresponds to the lowest value in the array of noise powers 1006.

Additionally, in some embodiments, the AFA may trigger frequency dependent adjustments in the DSP, e.g., the rate of down-sampling, and can make adjustments to provide subsequent processing steps with frequency independent data. The information on signal reliability is passed to those DSP blocks, too. There, e.g., filter gains are adjusted depending on signal reliability. Also adjusted can be signal level thresholds of probability thresholds for triggering some functionality, or other, e.g. probabilistic parameters.

Figure 11:
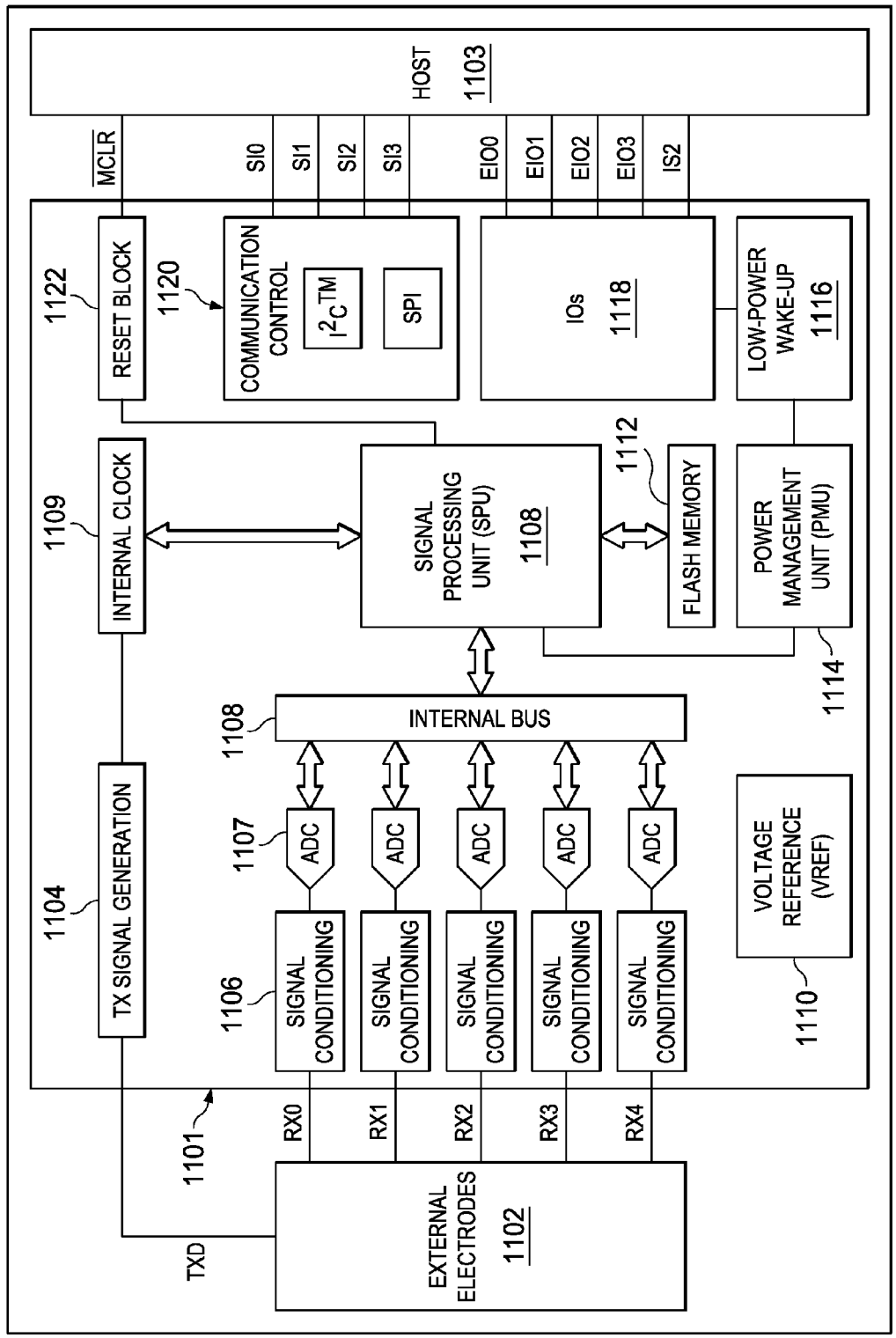
FIG. 11 is an exemplary system implementing methods according to embodiments.

If the measured noise values exceed pre-defined thresholds at all frequencies, the system can be interpreted as inoperable, which can be signaled to the host unit (FIG. 11). Then, the search for a noise-free operating frequency is continued.

In another embodiment, noise detection may be implemented by computing the ratio of the power of low-pass filtered signal 902 and over-all power and to comparing this to a pre-defined threshold. Alternatively, any sub-band not containing hand gestures can be evaluated.

Extensive investigation showed that the spectral noise bands of fluorescent lamps and USB chargers typically are significantly broader than the decimated sampling rate, which justifies the assumption of a relatively flat noise spectrum in the decimated signal. This allows for detection of HF noise sources in a sub-band of the decimated signal, which is not covered by the target signal or other known low-frequency noise sources.

Turning now to FIG. 11, a block diagram illustrating a particular implementation of a sensor system 1100 including noise robustness according to embodiments. The system 1100 includes a sensing controller 1101, sensing electrodes 1102, and a host system 1103. The sensing electrodes 1102 may implement a configuration such as shown in FIG. 1. The host 1103 may be any system that can make use of capacitive sensor signals and/or information or data derived therefrom, such as cell phones, laptop computers, I/O devices, and the like.

In the example illustrated, a TX signal generator 1104 provides the transmitter signal $V_{TX}$ to the transmit electrode TXD. Receive electrodes RX0-RX4 are received at signal conditioning modules 1106 for implementing filtering, etc. The outputs of signal conditioning are provided to ADCs 1107 and, via signal lines or other medium such as a bus 1108, to a signal processing unit 1108. The signal processing unit 1108 may implement the functionality of the DSP (FIG. 5, FIG. 10). Resulting outputs may be provided via IO unit 1118 to the host 1103.

The system may further include a variety of additional modules, such as internal clock 1109, memory such as flash memory 1112, a voltage reference 1110, power management 1114, low-power wake-up 1116, reset control 1122, and communication control 1120.

Although the invention has been described with respect to specific embodiments thereof, these embodiments are merely illustrative, and not restrictive of the invention. The description herein of illustrated embodiments of the invention, including the description in the Abstract and Summary, is not intended to be exhaustive or to limit the invention to the precise forms disclosed herein (and in particular, the inclusion of any particular embodiment, feature or function within the Abstract or Summary is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function, including any such embodiment feature or function described in the Abstract or Summary. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Reference throughout this specification to "one embodiment", "an embodiment", or "a specific embodiment" or similar terminology means that a particular feature, structure, or characteristic described in connection with the embodiment is included in at least one embodiment and may not necessarily be present in all embodiments. Thus, respective appearances of the phrases "in one embodiment", "in an embodiment", or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

Any suitable programming language can be used to implement the routines, methods or programs of embodiments of the invention described herein, including C, C++, Java, assembly language, etc. Different programming techniques can be employed such as procedural or object oriented. Any particular routine can execute on a single computer processing device or multiple computer processing devices, a single computer processor or multiple computer processors. Data may be stored in a single storage medium or distributed through multiple storage mediums, and may reside in a single database or multiple databases (or other data storage techniques). Although the steps, operations, or computations may be presented in a specific order, this order may be changed in different embodiments. In some embodiments, to the extent multiple steps are shown as sequential in this specification, some combination of such steps in alternative embodiments may be performed at the same time. The sequence of operations described herein can be interrupted, suspended, or otherwise controlled by another process, such as an operating system, kernel, etc. The routines can operate in an operating system environment or as stand-alone routines. Functions, routines, methods, steps and operations described herein can be performed in hardware, software, firmware or any combination thereof.

Embodiments described herein can be implemented in the form of control logic in software or hardware or a combination of both. The control logic may be stored in an information storage medium, such as a computer-readable medium, as a plurality of instructions adapted to direct an information processing device to perform a set of steps disclosed in the various embodiments. Based on the disclosure and teachings provided herein, a person of ordinary skill in the art will appreciate other ways and/or methods to implement the invention.

It is also within the spirit and scope of the invention to implement in software programming or code any of the steps, operations, methods, routines or portions thereof described herein, where such software programming or code can be stored in a computer-readable medium and can be operated on by a processor to permit a computer to perform any of the steps, operations, methods, routines or portions thereof described herein. The invention may be implemented by using software programming or code in one or more general purpose digital computers, by using application specific integrated circuits, programmable logic devices, field programmable gate arrays, and so on. Optical, chemical, biological, quantum or nanoengineered systems, components and mechanisms may be used. In general, the functions of the invention can be achieved by any means as is known in the art. For example, distributed, or networked systems, components and circuits can be used. In another example, communication or transfer (or otherwise moving from one place to another) of data may be wired, wireless, or by any other means.

A "computer-readable medium" may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory. Such computer-readable medium shall generally be machine readable and include software programming or code that can be human readable (e.g., source code) or machine readable (e.g., object code). Examples of non-transitory computer-readable media can include random access memories, read-only memories, hard drives, data cartridges, magnetic tapes, floppy diskettes, flash memory drives, optical data storage devices, compact-disc read-only memories, and other appropriate computer memories and data storage devices. In an illustrative embodiment, some or all of the software components may reside on a single server computer or on any combination of separate server computers. As one skilled in the art can appreciate, a computer program product implementing an embodiment disclosed herein may comprise one or more non-transitory computer readable media storing computer instructions translatable by one or more processors in a computing environment.

A "processor" includes any, hardware system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real-time," "offline," in a "batch mode," etc. Portions of processing can be performed at different times and at different locations, by different (or the same) processing systems.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, process, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, including the claims that follow, a term preceded by "a" or "an" (and "the" when antecedent basis is "a" or "an") includes both singular and plural of such term, unless clearly indicated within the claim otherwise (i.e., that the reference "a" or "an" clearly indicates only the singular or only the plural). Also, as used in the description herein and throughout the claims that follow, the meaning of "in" includes "in" and "on" unless the context clearly dictates otherwise.

It will be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/Figures should be considered only as exemplary, and not limiting, unless otherwise specifically noted.

What is claimed is:

1. A capacitive sensor, comprising:
   a transmit electrode configured to provide an alternating electric field for the capacitive sensor;
   an oscillator for generating a carrier signal;
   one or more receive electrodes for detecting variations in the alternating electric field;
   an adaptive frequency adjustment unit coupled with the oscillator and configured to adjust an operating frequency of the alternating electric field responsive to detection of a noise measure, and
   a modulator configured to modulate the carrier signal at the operating frequency depending on a sensed capacitance, wherein the modulated carrier signal is synchronously demodulated and downsampled.

2. The capacitive sensor of claim 1, wherein the adaptive frequency adjustment unit is configured to determine a plurality of noise measures at potential operating frequencies and select a new operating frequency.

3. The capacitive sensor of claim 2, wherein the new operating frequency corresponds to a minimum or maximum of the plurality of noise measures.

4. The capacitive sensor of claim 2, wherein the new operating frequency corresponds to a sufficiently high or sufficiently low noise measure of the plurality of noise measures.

5. The capacitive sensor of claim 2, wherein the noise measures comprise noise powers.

6. The capacitive sensor of claim 2, wherein the noise measure is a measure for the noise at the operating frequency.

7. The capacitive sensor of claim 6, wherein the noise measure is a measure for the noise power at the operating frequency.

8. The capacitive sensor of claim 7, wherein a carrier signal at the operating frequency is modulated by a low-frequency target signal using amplitude modulation.

9. The capacitive sensor of claim 1, further comprising an analog-to-digital converter configured to convert an analog signal received from the one or more receive electrodes into a digital signal, wherein a sampling frequency is twice the frequency of the carrier signal.

10. The capacitive sensor of claim 8, wherein the noise measure is a measure of the signal energy of the downsampled signal in a frequency band that is unequal the frequency band of the low-frequency modulating signal and unequal frequency bands that contain low-frequency noise.

11. The capacitive sensor of claim 2, wherein the adaptive frequency adjustment unit is configured to select a new operating frequency if a detected noise measure exceeds or falls below a predetermined threshold.

12. The capacitive sensor of claim 11, wherein the new operating frequency is an operating frequency that corresponds to a minimum or maximum of the plurality of noise measures.

13. A method for providing noise robustness to a capacitive sensing system, comprising:
   generating a carrier signal and modulating the carrier signal at the operating frequency depending on a sensed capacitance;
   defining a plurality of potential operating transmit frequencies;
   determining a corresponding noise measure corresponding to each of the potential operating frequencies;
   operating the capacitive sensing system at one of the plurality of potential operating transmit frequencies;
   measuring an operating noise measure at the operating frequency; and
   selecting a new operating frequency responsive to a value of the measured operating noise measure;
   wherein the modulated carrier signal is synchronously demodulated and downsampled.

14. The method of claim 13, wherein the new operating frequency corresponds to a minimum or maximum of the plurality of noise measures.

15. The method of claim 13, wherein the new operating frequency corresponds to a sufficiently high or sufficiently low noise measure of the plurality of noise measures.

16. The method of claim 13, wherein the noise measures comprise noise powers.

17. The method of claim 13, wherein the noise measure is a measure for the noise at the operating frequency.

18. The method of claim 13, wherein the noise measure is a measure for the noise power at the operating frequency.

19. The method of claim 13, wherein a carrier signal at the operating frequency is modulated by a low-frequency target signal using amplitude modulation.

20. The method of claim 13, further converting an analog signal received from the one or more receive electrodes into a digital signal with a sampling frequency that is twice the frequency of the carrier signal.

21. The method of claim 19, wherein the noise measure is a measure of the signal energy of the downsampled signal in a frequency band that is unequal the frequency band of the low-frequency modulating signal and unequal frequency bands that contain low-frequency noise.

22. The method of claim 13, including selecting a new operating frequency if a detected noise measure exceeds or falls below a predetermined threshold.

23. The method of claim 22, wherein the new operating frequency is an operating frequency that corresponds to a minimum or maximum of the plurality of noise measures.

24. A capacitive sensor system, comprising:
   a transmit electrode configured to provide an alternating electric field to a capacitive sensor; a plurality of reception electrodes associated with the transmit electrode for detecting variations in the alternating electric field generated by the transmit electrode; and an adaptive frequency adjustment unit configured to adjust an operating frequency of the alternating electric field in accordance with modeling the capacitive sensor system as an amplitude modulation system with direct sampling and synchronous demodulation.

25. The capacitive sensor system of claim 24, wherein the adaptive frequency adjustment unit is configured to determine a plurality of noise measures at potential operating frequencies and select an operating frequency that corresponds to a minimum or maximum of the plurality of noise measures.

26. The capacitive sensor system of claim 25, wherein the adaptive frequency adjustment unit is configured to select a new operating frequency if a detected noise measure exceeds a predetermined threshold.

27. The capacitive sensor system of claim 26, wherein the noise measure is a noise power.

28. The capacitive sensor system of claim 24, further comprising:
- an oscillator for generating a carrier signal coupled with the frequency adjustment unit;
- a modulator operable to modulate the carrier signal at the operating frequency depending on a sensed capacitance, wherein the modulated carrier signal is synchronously demodulated and downsampled.

* * * * *